(12) United States Patent  (10) Patent No.: US 7,808,616 B2
Yamamoto  (45) Date of Patent: Oct. 5, 2010

(54) RETICLE TRANSPORT APPARATUS, EXPOSURE APPARATUS, RETICLE TRANSPORT METHOD, AND RETICLE PROCESSING METHOD

(75) Inventor: Hajime Yamamoto, Saitama-ken (JP)

(73) Assignee: Nikon Corporation, Tokyo (JP)

( * ) Notice: Subject to any disclaimer, the term of this patent is extended or adjusted under 35 U.S.C. 154(b) by 826 days.

(21) Appl. No.: 11/645,659

(22) Filed: Dec. 27, 2006

(65) Prior Publication Data

US 2007/0146681 A1 Jun. 28, 2007

Related U.S. Application Data

(60) Provisional application No. 60/853,450, filed on Oct. 23, 2006.

(30) Foreign Application Priority Data

Dec. 28, 2005 (JP) ............................ 2005-377668

(51) Int. Cl.
*G03B 27/62* (2006.01)
(52) U.S. Cl. ...................................... 355/75
(58) Field of Classification Search ............... 355/75; 361/234; 414/222.01
See application file for complete search history.

(56) References Cited

U.S. PATENT DOCUMENTS

| | | | |
|---|---|---|---|
| 6,090,176 A | 7/2000 | Yoshitake et al. |
| 6,153,044 A | 11/2000 | Klebanoff et al. |
| 6,239,863 B1 | 5/2001 | Catey et al. |
| 6,253,464 B1 | 7/2001 | Klebanoff et al. |
| 6,281,510 B1 | 8/2001 | Yoshitake et al. |
| 6,317,479 B1 | 11/2001 | Chiba et al. |
| 6,387,602 B1 | 5/2002 | Hayden et al. |
| 6,452,661 B1 | 9/2002 | Komatsuda |
| 6,619,903 B2 | 9/2003 | Friedman et al. |
| 6,646,720 B2 | 11/2003 | Ramamoorthy et al. |
| 6,728,332 B2 | 4/2004 | Chiba et al. |
| 6,753,945 B2 | 6/2004 | Heerens et al. |
| 6,826,451 B2 | 11/2004 | del Puerto et al. |
| 6,906,783 B2 | 6/2005 | del Puerto et al. |
| 6,912,043 B2 | 6/2005 | Galburt |
| 6,984,474 B2 | 1/2006 | Roux et al. |

(Continued)

FOREIGN PATENT DOCUMENTS

EP 1 341 042 A2 9/2003

(Continued)

OTHER PUBLICATIONS

European Search Report, dated Dec. 4, 2009, for corresponding EP Application No. 09159665.0-2222 (8 pages).

*Primary Examiner*—Peter B Kim
(74) *Attorney, Agent, or Firm*—Finnegan, Henderson, Farabow, Garrett & Dunner, L.L.P.

(57) ABSTRACT

A reticle transport apparatus transports a reticle to and from a processing atmosphere. A reticle loader loads the reticle into the processing atmosphere, with at least a portion of the reticle being covered by a cover. A cover manipulator, in the processing atmosphere, removes the reticle from the cover and transfers the cover, without the removed reticle, to the reticle loader, and the reticle loader unloads the cover from the processing atmosphere. A cover cleaner, outside of the processing atmosphere, cleans the cover. When processing involving the reticle is completed, the reticle is returned to the cleaned cover or is placed in a different cover.

21 Claims, 9 Drawing Sheets

U.S. PATENT DOCUMENTS

| | | |
|---|---|---|
| 6,991,416 B2 | 1/2006 | del Puerto et al. |
| 7,042,554 B2 | 5/2006 | Galburt |
| 7,057,711 B2 | 6/2006 | del Puerto et al. |
| 7,123,344 B2 | 10/2006 | Van De Ven et al. |
| 7,153,612 B2 | 12/2006 | Heerens et al. |
| 2004/0090605 A1 | 5/2004 | Yogev |
| 2007/0002516 A1* | 1/2007 | Matsumoto ................. 361/234 |

FOREIGN PATENT DOCUMENTS

WO    WO 01/61409 A2    8/2001

* cited by examiner

RETICLE TRANSPORT APPARATUS, EXPOSURE APPARATUS, RETICLE TRANSPORT METHOD, AND RETICLE PROCESSING METHOD

This application claims priority to U.S. Provisional Patent Application No. 60/853,450, filed on Oct. 23, 2006, the contents of which are incorporated herein by reference. This application also claims priority to Japanese Patent Application No. 2005-377668, filed on Dec. 28, 2005, the contents of which are incorporated herein by reference.

BACKGROUND OF THE INVENTION

A. Field of the Invention

The present invention relates to a reticle transport apparatus for transporting a reticle with respect to an exposure atmosphere chamber, an exposure apparatus comprising the reticle transport apparatus, a reticle transport method, and a reticle processing method.

B. Description of the Related Art

Recently developed projection exposure apparatuses expose the pattern of a reticle onto a photosensitive substrate using extreme ultraviolet (EUV) light in the range of wavelengths of approximately 5~40 nm. In EUVL (extreme ultraviolet light lithography) exposure apparatuses, because EUV light is absorbed by air, a high degree of vacuum is maintained within the chamber that accommodates the apparatus, and special contrivances are also necessary when transporting the reticle.

A reflecting type reticle is typically used in the EUVL exposure apparatus, because few materials have a high transmittivity with respect to short wavelength light. A transparent thin film called a pellicle may protect the pattern surface of a reticle used in an exposure apparatus that uses normal visible light or ultraviolet rays. However, in the EUV exposure apparatus, it is not possible to form a pellicle, because there are few materials that have high transmittivity with respect to short wavelength light. Therefore, at the time of reticle transport and storage, the reticle is covered within a protective cover (protective member), and the pattern region of the reticle is protected (see U.S. Pat. No. 6,239,863).

While the reticle is protected within the protective cover and transported, the reticle and the protective cover may come into contact, and debris may be generated at that contact point. Foreign matter that has occurred due to the generation of debris may thus accumulate, and the pattern region of the reticle may be contaminated.

SUMMARY OF THE INVENTION

In one embodiment of the present invention, a reticle transport apparatus prevents foreign matter from adhering to the reticle.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, a reticle transport apparatus transports a reticle to and from a processing atmosphere. A reticle loader loads the reticle into the processing atmosphere, with at least a portion of the reticle being covered by a cover. A cover manipulator, in the processing atmosphere, removes the reticle from the cover and transfers the cover, without the removed reticle, to the reticle loader for unloading the cover from the processing atmosphere. A cover cleaner, outside of the processing atmosphere, cleans the cover.

To further achieve the objects and in accordance with the purpose of the invention, as embodied and broadly described herein, a reticle transport method transports a reticle to and from a processing atmosphere. The method includes the steps of: loading the reticle into the processing atmosphere, at least a portion of the reticle being covered by a cover; detaching the cover from the reticle in the processing atmosphere; and unloading the detached cover from the processing atmosphere. The method may further include the step of cleaning the cover.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

A reticle transport apparatus transports a reticle into and out of a processing atmosphere chamber. A reticle loader loads the reticle into the processing atmosphere chamber. At least a portion of the reticle is covered by a cover. A cover unloader unloads the cover, which is detached from the reticle, from the processing atmosphere chamber. A cover cleaner cleans the unloaded cover.

The reticle transport apparatus removes foreign matter adhered to the cover. In particular, the cover cleaner cleans the cover for covering at least the region of the reticle where a pattern is formed. Therefore, it is possible to prevent foreign matter from adhering to the reticle, while the reticle is covered by the cover. This improves exposure performance.

In addition, the cover may be removed from the exposure atmosphere chamber while the reticle is within the exposure atmosphere chamber. The cover covering at least a portion of the reticle is detached from the reticle. Therefore, the cover may be inspected to determine whether or not debris is adhering to the cover. The cover may also be cleaned or replaced. Therefore, it is possible to prevent foreign matter from transferring to and adhering to the reticle.

In addition, if the reticle is covered with a new cover, a contaminated cover may be discarded or cleaned.

Figure 1:
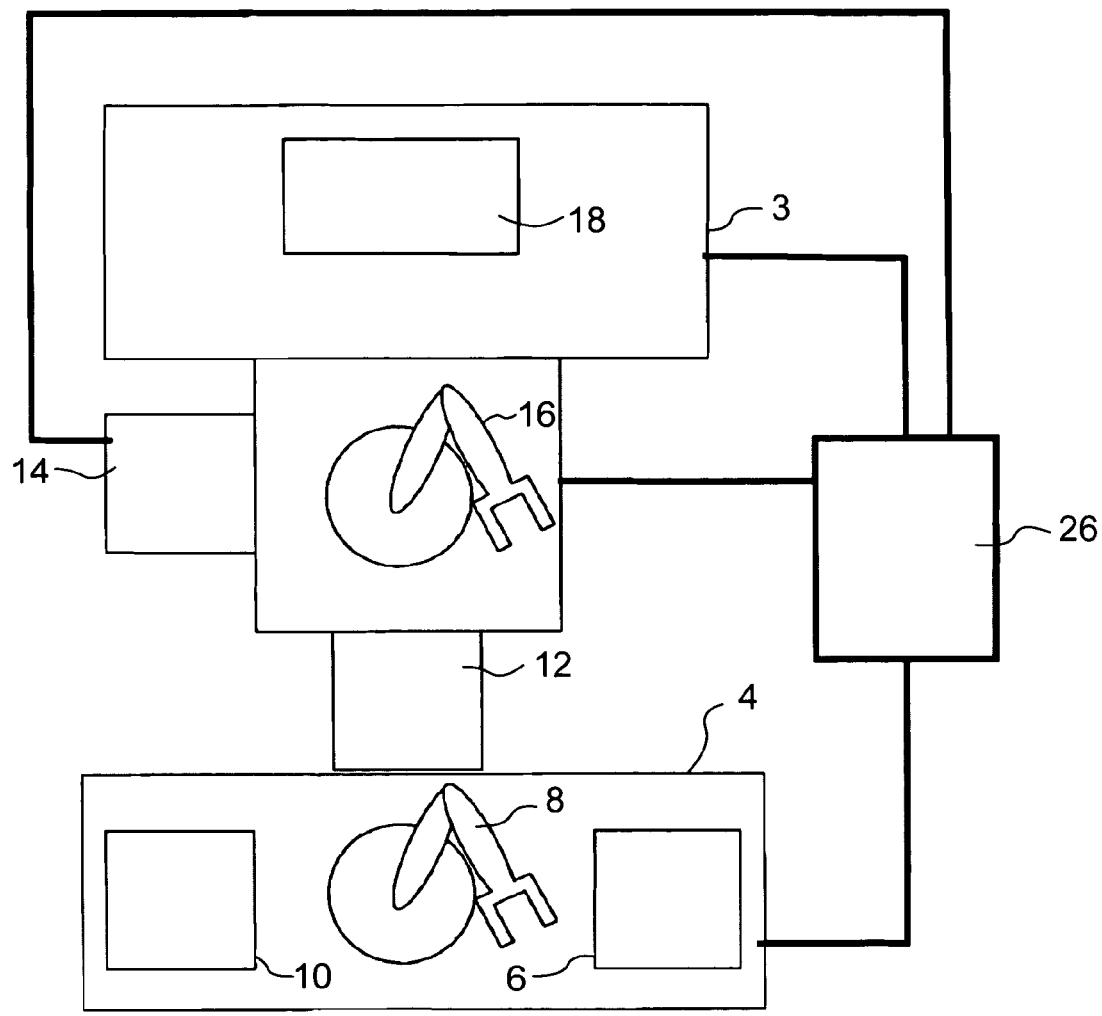
FIG. 1 is a schematic diagram of an exposure apparatus.

The exposure apparatus relating to a first embodiment of the present invention will be explained while referring to drawings. FIG. 1 shows a schematic configuration of the exposure apparatus relating to the first embodiment. An exposure part 3 may expose a pattern formed on a reticle onto a photosensitive substrate. A reticle transport part (reticle transport apparatus) 4 loads and unloads the reticle into and out of the exposure part 3 via a load lock chamber 12. A control part 26 controls the operation of the exposure apparatus and preferably includes a programmable processor such as a microprocessor.

In the reticle transport part 4, an air reticle library 6 holds a plurality of reticles on which various patterns are formed. An air side robot 8 loads the prescribed reticle from the air reticle library 6 and transports the reticle to the load lock chamber 12. A cleaning chamber 10 cleans a protective cover that covers the reticle. The air reticle library 6 accommodates reticles that are covered by a protective cover. The surfaces of the reticles on which a pattern is formed are covered by a protective cover prepared to respectively correspond thereto.

Figure 2:
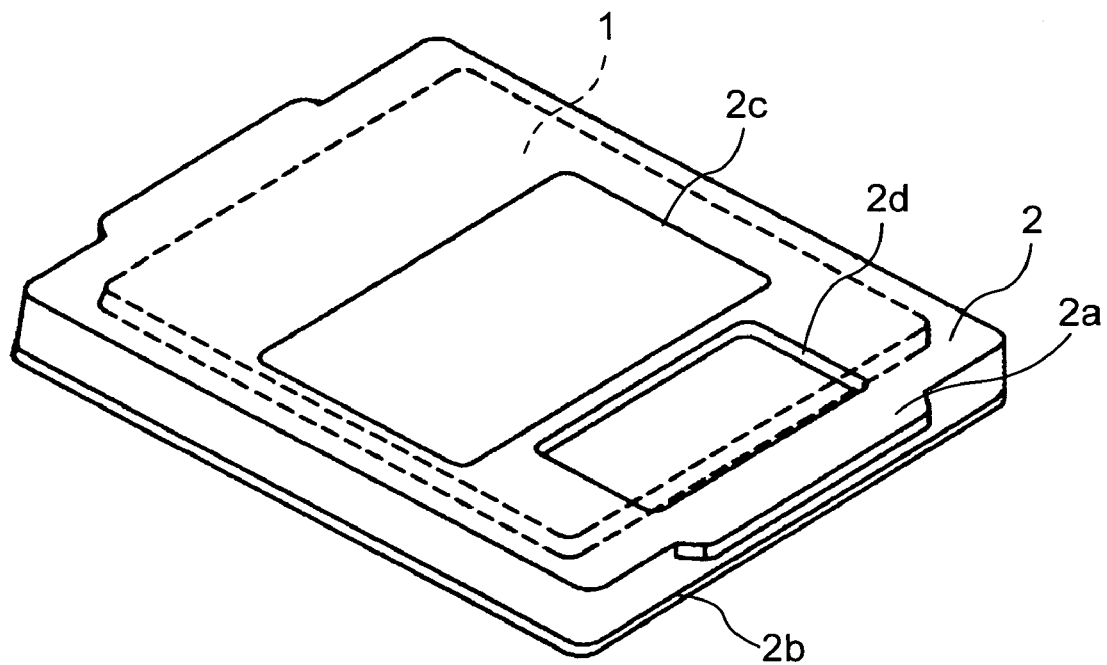
FIG. 2 shows a protective cover for a reticle.
Figure 3:
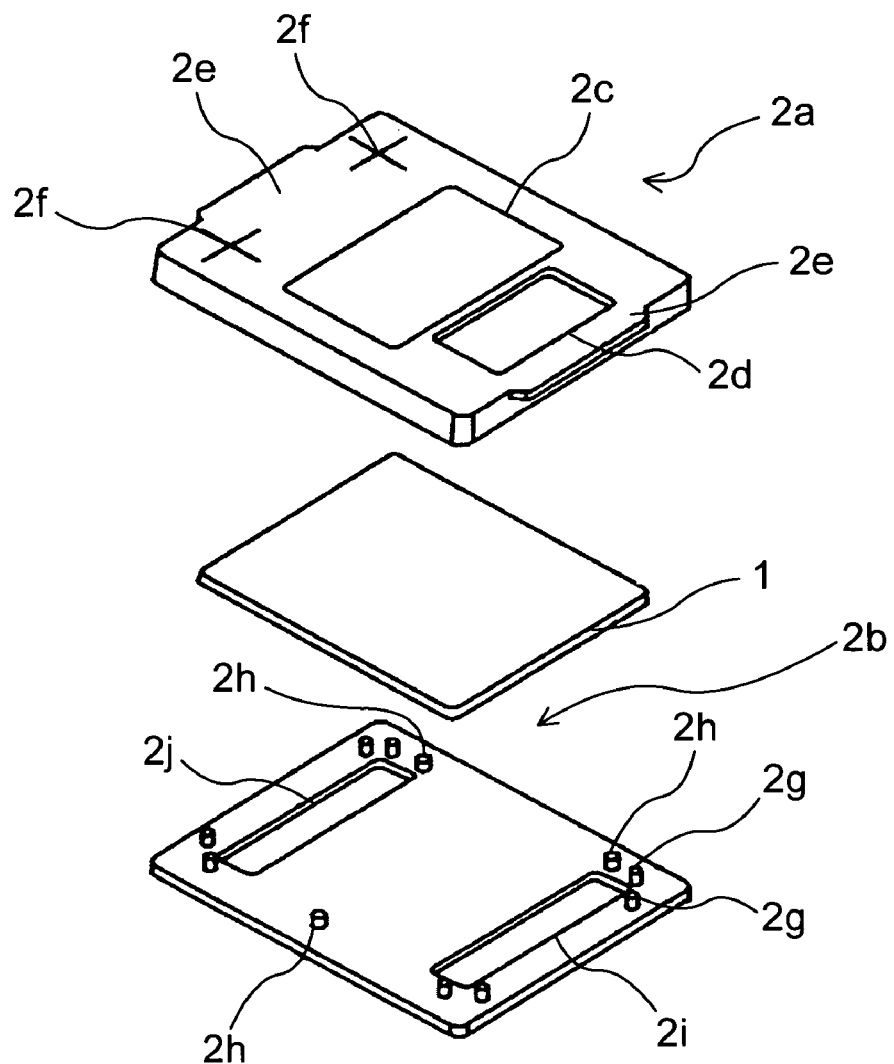
FIG. 3 shows an exploded view of the protective cover of FIG. 2.

FIG. 2 shows a protective cover 2 that covers a reticle 1, and FIG. 3 is an exploded view for explaining the configuration of the protective cover 2. The protective cover 2 includes an upper cover 2a and a lower cover 2b. The upper cover 2a, preferably formed of a metal such as aluminum, for example, has a filter 2c and a transparent window 2d. The filter 2c promotes an adequate air flow, while preventing fine particles such as debris from penetrating to the interior of the protective cover 2. The protective cover 2 goes back and forth between ambient air and vacuum. When the upper cover 2a and the lower cover 2b of the protective cover 2 are engaged to form an interior space, the air pressure difference between the exterior and interior space of the protective cover 2 is reduced so that force resulting from the pressure difference is not exerted on the upper cover 2a and the lower cover 2b. The transparent window 2d is for observing the status of the reticle 1 from outside the protective cover 2.

Two protruding parts 2e, provided on the upper cover 2a at two locations, catch on a holding member and are held. The lower cover 2b is lowered, and the upper cover 2a and the lower cover 2b are separated. The upper cover 2a includes two position detection marks 2f for detecting the position thereof. The position of the upper cover 2a may be detected by measuring this position using a position measurement apparatus.

The lower cover 2b, preferably formed of a metal such as aluminum, for example, has positioning pins 2g in pairs of two in the four corners and reticle holding protrusions 2h in three locations. The positioning pins 2g position the reticle 1 in the planar direction when holding the reticle 1. The reticle holding protrusions 2h support the reticle 1 at three points.

Two transparent windows 2i, 2j, preferably made of glass, are provided on the lower cover 2b, and marks and ID marks formed on the reticle 1 are observed through the transparent windows 2i, 2j from the lower side of the lower cover 2b. FIG. 3 shows transparent windows 2i, 2j, but if the positions of the marks and ID marks are fixed on the reticle 1, only one transparent window may be needed. The reticle 1, accommodated in the protective cover 2, is put into the air reticle library 6.

Figure 4:
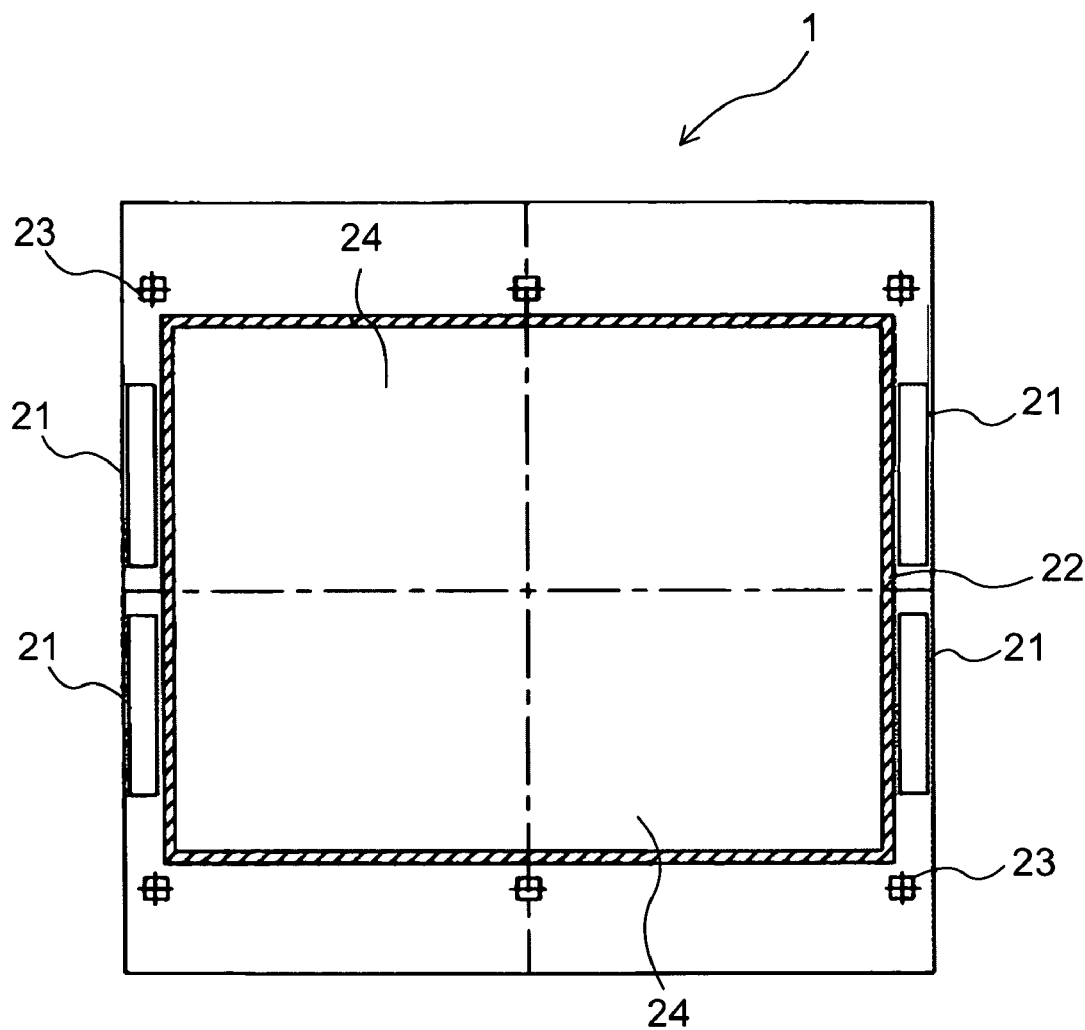
FIG. 4 is a plan view of a reticle.

FIG. 4 shows a plan view of one example of a pattern surface of the reticle 1 from the lower side. On the pattern surface of the reticle 1, a pattern such as a semiconductor circuit to be transferred onto a wafer is formed in a central pattern region 24. A non-reflection region 22, such as an absorbing body, surrounds the pattern region 24. Reference reflecting surfaces 21 are outside of the non-reflecting region 22. Alignment marks and ID marks are formed in a mark region 23.

The protective cover 2 preferably covers at least pattern region 24 of the reticle 1. The protective cover 2 preferably protects the reticle 1 from problems such as adherence of debris by covering the entire pattern surface of the reticle 1 as well as the entire reticle 1. In the present embodiment, the protective cover 2 covers the entire reticle 1 using an upper cover 2a and a lower cover 2b. It is also possible to use a protective cover such as the protective cover disclosed in U.S. Pat. No. 6,239,863. The protective cover may protect only the pattern surface of the reticle 1, or the protective cover may protect only the pattern region of the reticle 1. In addition, the present invention may be used even if it is other than these reticle covers, and it may be applied to a reticle cover that covers only a portion of the reticle.

In the exposure apparatus, the load lock chamber 12 receives the reticle 1 from the reticle transport part 4. A prealignment chamber 14 pre-aligns the reticle 1. A vacuum side robot 16 transports the reticle 1 and the protective cover 2 between the load lock chamber 12 and the prealignment chamber 14. The exposure part 3, the prealignment chamber 14, and the vacuum side robot 16 are all within a vacuum atmosphere chamber (exposure atmosphere chamber, processing atmosphere chamber). In addition, the load lock chamber 12 is configured for vacuum exhaust and air release.

Figure 5:
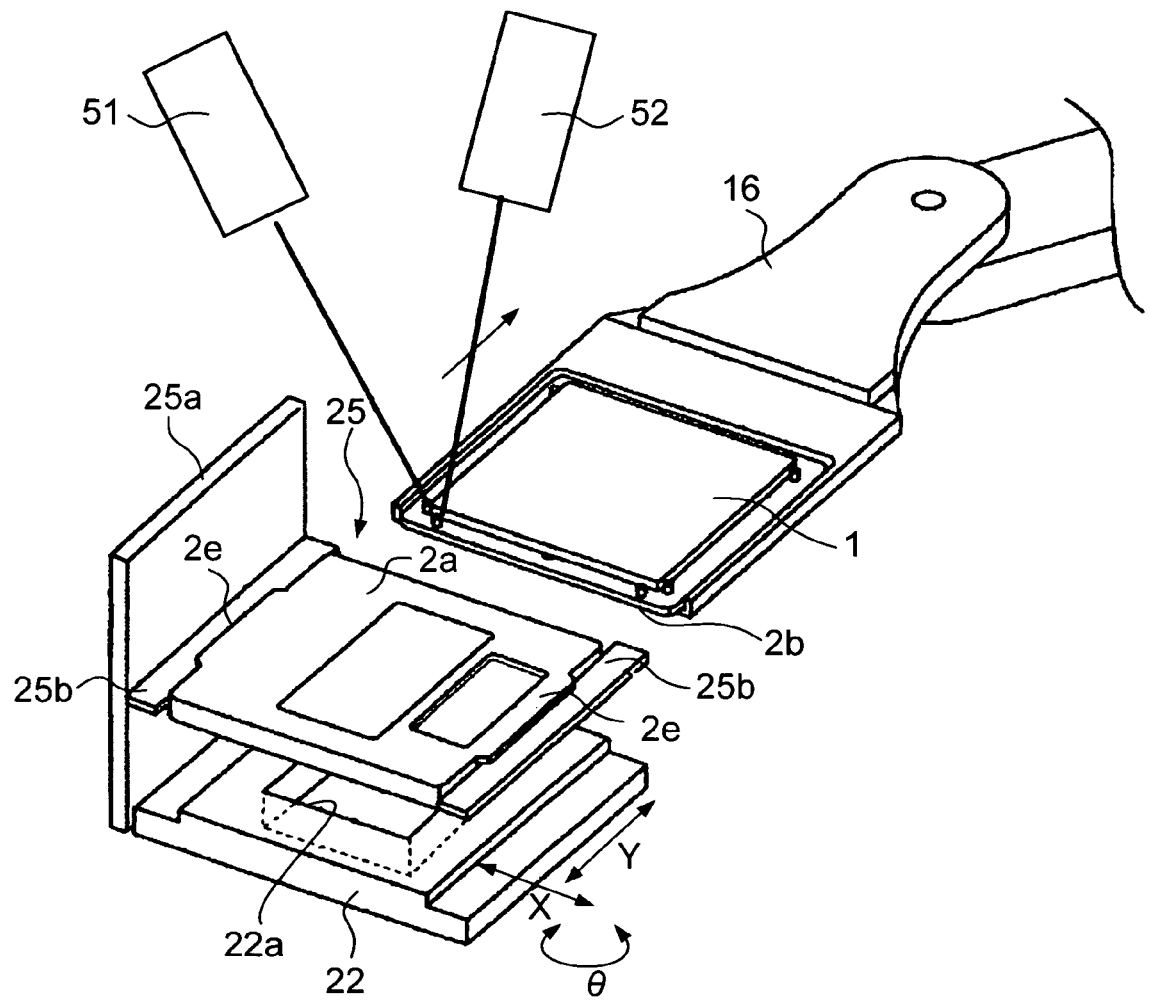
FIG. 5 is a partially schematic view of the protective cover of FIG. 2 in a prealignment chamber.

FIG. 5 shows the prealignment chamber 14. A CFP opener 25 separates the protective cover 2 into the upper cover 2a and the lower cover 2b. The reticle 1 is on the lower cover 2b. The CFP opener 25 is a one-level rack having vertical plates 25a and a horizontal plate 25b (the other vertical plate 25a is omitted from the drawing). The protruding parts 2e of the upper cover 2a catch onto the horizontal plate 25b, and the upper plate 2a is suspended.

The protective cover 2 is lowered from above the horizontal plate 25b. The front end part of the vacuum side robot 16 supports the lower surface of the lower cover 2b. The protruding parts 2e of the upper cover 2a catch on the horizontal plate 25b, and the vacuum side robot 16 is lowered. The lower cover 2b and the reticle 1 that is loaded thereupon then drop downward. The upper cover 2a, however, remains held on the horizontal plate 25b, because the protrusion parts 2e catch on the horizontal plate 25b. The upper cover 2a thus separates from the lower cover 2b and the reticle 1. Then, the reticle 1, mounted on the lower cover 2b, may be extracted by pulling the vacuum side robot 16 in the direction of the arrow.

An alignment stage 22 may be provided on the CFP opener 25. The alignment stage 22 moves in the X direction, as shown in the drawing, moves in the Y direction perpendicular to the X direction, and rotates (θ) around a Z direction axis, which is perpendicular to the X direction and the Y direction. In this example, the horizontal plate 25b onto which the upper cover 2a is mounted is fixed, but it is also possible to provide a drive means to move it and adjust the position of the upper cover.

The position of the reticle 1 may be pre-aligned. The vacuum side robot 16 is lowered, while the front end part of the vacuum side robot 16 holds the lower cover 2b, on which the reticle 1 is mounted. The lower cover 2b is thus mounted on the alignment stage 22. The center part of the alignment stage 22 preferably has a protruding shape, so that the vacuum side robot 16 can be lowered to a position such that the front end part of the vacuum side robot 16 does not come into contact with the lower cover 2b. A through hole 22a, provided at the center part of the alignment stage 22, enables detection of the position of the lower cover 2b and the position of the reticle 1 by a position detection apparatus. In addition, it is possible to perform prealignment of the reticle 1 by moving the alignment stage 22.

In the exposure part 3, a reticle holder 18 holds the reticle 1 loaded by the vacuum side robot 16. The reticle holder 18 adsorbs the surface at the opposite side of the pattern surface of the reticle 1 shown in FIG. 4 by, for example, an electrostatic chuck. A light source illuminates the pattern of the reticle 1, and a projection optical system projects the pattern onto a photosensitive substrate. The photosensitive substrate is thus exposed to the pattern of the reticle.

Figure 6:
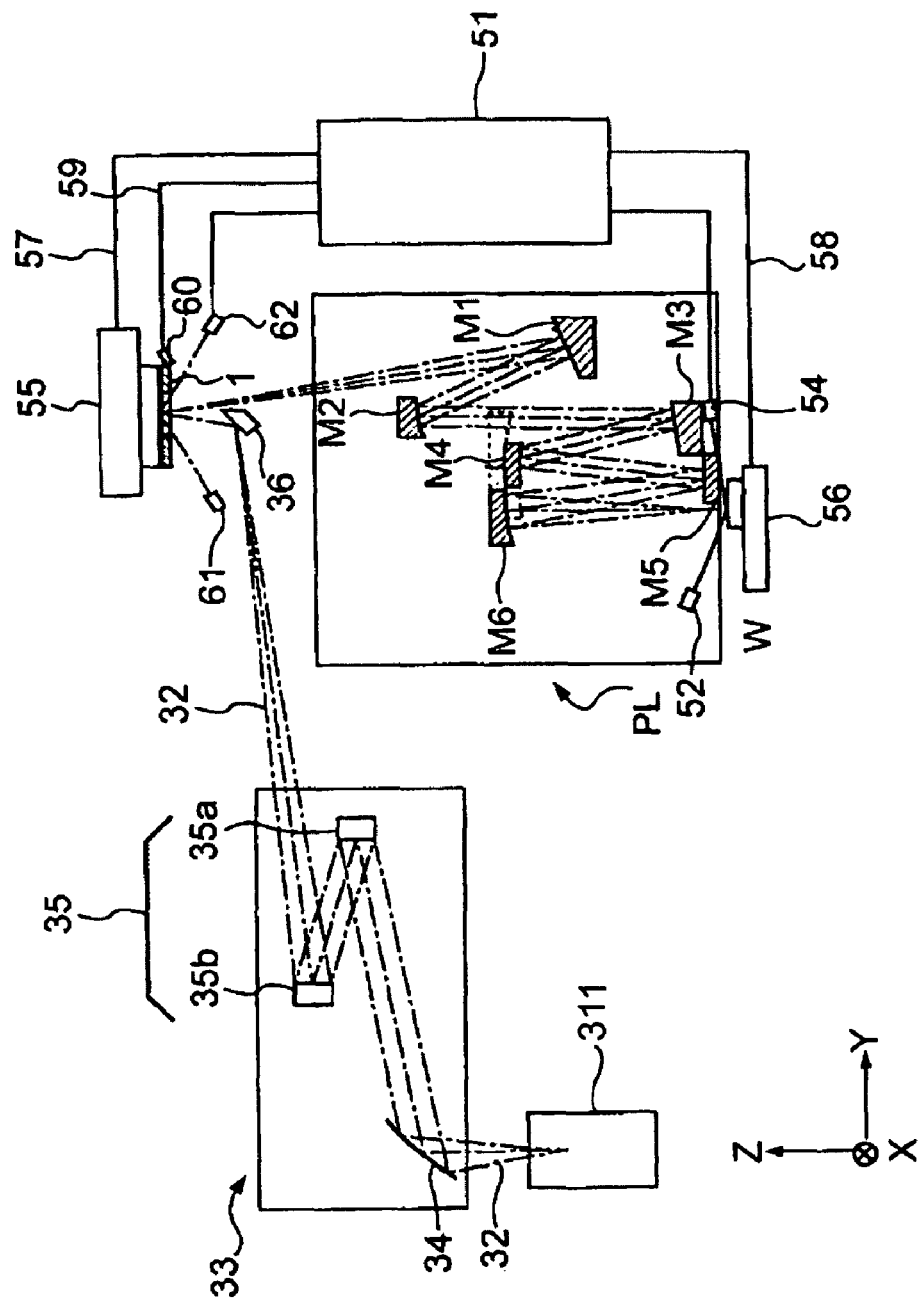
FIG. 6 is a schematic view of an EUV exposure device.

FIG. 6 is an outline diagram showing an EUV exposure device. EUV light 32 emitted from an EUV light source 311 enters an illumination optical system 33, becomes an approximately parallel light beam by a concave reflecting mirror 34 which acts as a collimator, and enters an optical integrator 35 comprising a pair of a fly-eye mirrors 35a and 35b. As the pair of fly-eye mirrors 35a and 35b, the fly-eye mirrors disclosed in U.S. Pat. No. 6,452,661, the contents of which are incorporated herein by reference, may be used.

In the vicinity of the reflection plane of the second fly-eye mirror 35b, namely in the vicinity of the exit plane of the optical integrator 35, a substantial extended light source having a specific shape is formed. Light from the substantial extended light source is deflected by a plane reflecting mirror 36, and forms an arc shaped illumination area on a reticle 1. Light from an illuminated pattern of the reticle 1 forms an image of the reticle pattern on a wafer W by a projection optical system PL comprising multiple reflecting mirrors (six reflecting mirrors M1~M6 are shown in FIG. 6 as an example). The reticle 1 is mounted on a reticle stage 55 and can be moved in each of the x, y, and z axes directions and rotated around each of the axes.

The wafer W is mounted on a wafer stage 56 and can be moved in each of the x, y, and z axes directions and rotated around each of these axes. Freedom of movement may also be fewer than this. The x and y direction positions of the wafer stage and the reticle stage are measured independently by an interferometer, and the measured data are input to a control device 51. Also, the control device 51 outputs driving signals 57 and 58 to the reticle stage 55 and the wafer stage 56. Each stage moves by an actuator such as a linear motor or an air actuator.

A light source 52 emits light toward the wafer W, a photodetector 54 detects the light reflected from the wafer W to measure the position of the wafer W. Similarly, a light source 61 emits light toward the reticle 1, and a photo-detector 62 detects the light reflected from the reticle 1 to measure the position of the wafer W. The control device 51 receives the measured data.

Figure 7:
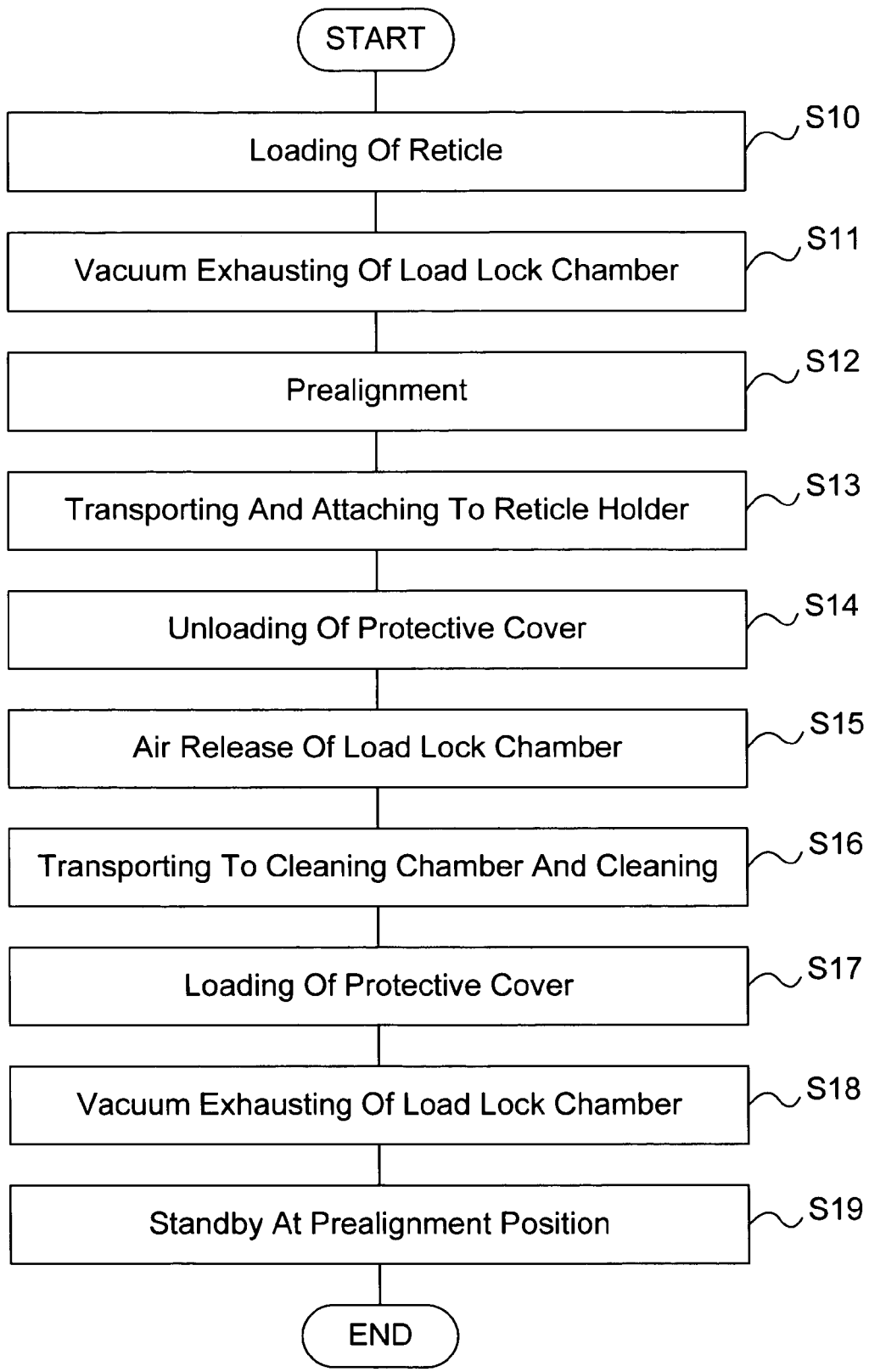
FIG. 7 is a flow chart of a reticle loading process.

Next, a reticle transport method that transports the reticle 1 into and out of the exposure part 3 by the reticle transport part 4 relating to the first embodiment will be explained while referring to the flowchart in FIG. 7.

The reticle 1, which has been protected by the protective cover 2, is extracted from the air reticle library 6 and loaded into the load lock chamber 12 using the air side robot 8 (step S10).

After the reticle 1 that has been protected by the protective cover 2 in step S10 is loaded into the lock chamber 12, the load lock chamber 12 is exhausted for loading the reticle 1 into the vacuum atmosphere of the exposure part 3, and the interior of the load lock chamber 12 is made into a vacuum atmosphere (step S11). At this time, the interior of the protective cover 2 also undergoes vacuum exhaust and becomes a vacuum atmosphere. Next, the vacuum side robot 16 extracts the reticle 1 covered by the protective cover 2 from the load lock chamber 12 and loads it into the prealignment chamber 14. The reticle 1 is pre-aligned (step S12). At this time, the upper cover 2a of the protective cover 2 is removed.

Next, the vacuum side robot 16 is used to transfer the reticle 1 that is covered by the lower cover 2b of the protective cover 2 from the prealignment chamber 14. Then, the reticle 1 is moved to the reticle holder 18. The reticle 1 is adsorbed to the reticle holder 18 (step S13), and the lower cover 2b of the protective cover 2 is removed. Next, after the reticle 1 is adsorbed by the reticle holder 18 in step S13, the vacuum side robot 16 unloads the protective cover 2, which includes the upper cover 2a and the lower cover 2b, from the exposure part 3 (step S14: protective cover unloading process) and loads it into the load lock chamber 12. Debris may fly about within the load lock chamber 12 when the atmosphere of the load lock chamber 12 changes from vacuum to ambient air. Therefore, the upper cover 2a and the lower cover 2b may be closed during the unloading so that debris does not enter the interior space.

Next, after a protective cover 2 is loaded into the load lock chamber 12, air release of the load lock chamber 12 is performed, and the interior of the load lock chamber 12 changes to air atmosphere (step S15). At this time, the interior of the protective cover 2 is also air released, and it is made an air atmosphere. The air side robot 8 extracts the protective cover 2 from the load lock chamber 12 and transports the protective cover 2 to the cleaning chamber 10, and the protective cover 2 is cleaned (step S16: protective cover cleaning process).

The positioning pins 2g and the reticle holding protrusions 2h contact with the reticle 1 when the reticle 1 is accommodated within the protective cover 2. Dust generation may occur in the vicinity of the positioning pins 2g and the reticle holding protrusion 2h. Any foreign matter (debris) produced by this dust generation may adhere to the reticle holding protrusions 2h and the reticle 1. The foreign matter may accumulate on the protective cover 2 and the reticle 1 by repeated unloading and loading of the reticle 1, and foreign matter may adhere to the pattern region of the reticle 1, contaminating the pattern region of the reticle 1. In this way, due to the pattern region of the reticle 1 being contaminated by foreign matter, it is not possible to accurately expose the pattern of the reticle 1 onto the photosensitive substrate in the exposure part 3. This leads to a reduction in the conforming products rate of the semiconductor devices manufactured. Therefore, it is necessary to remove any foreign matter produced by dust generated in the vicinity of the positioning pins 2g and the reticle holding protrusions 2h.

Various well known cleaning methods can be used as the specific cleaning method in step S16. It is possible to use various cleaning methods such as wet cleaning, dry cleaning, or cleaning in which wind is produced by a blower, etc. to blow foreign matter off. Essentially, any cleaning technique that removes substances such as liquid, solid bodies, etc., that adversely affect exposure from the cover 2, can be used for the cleaning. For example, drying (baking) may be performed after performing ultrasonic cleaning (cleaning for approximately 3 minutes in an Absol liquid+approximately 2 minutes in an alkali cleaning solution+approximately 1 minute in pure water). After cleaning step S16, a particle counter, etc. may be used to confirm whether or not foreign matter (debris) is adhering. If foreign matter is not adhering, cleaning ends. If foreign matter is adhering, cleaning continues or is repeated.

Next, the air side robot 8 transfers the protective cover 2, for which cleaning is completed, from the cleaning chamber 10 to the load lock chamber 12 (step S17). Next, after the protective cover 2 is reloaded into the load lock chamber 12 in step S17, vacuum exhausting of the load lock chamber 12 is performed, and the interior of the load lock chamber 12 is made into a vacuum atmosphere (step S18). At this time, the interior of the protective cover 2 is also vacuum exhausted, and it becomes a vacuum atmosphere.

Next, the vacuum side robot 16 transfers the protective cover 2 from the load lock chamber 12 to the prealignment chamber 14. Then, the protective cover stands by until the reticle 1 is unloaded from the exposure part 3 (step S19). When the reticle 1 is unloaded from the exposure part 3, the vacuum side robot 16 unloads the lower cover 2b from the prealignment chamber 14, and the lower cover 2b is loaded into the exposure part 3. Then, the reticle 1, covered by the lower cover 2b, is carried to the prealignment chamber 14. The lower cover 2b and the upper cover 2a are closed in the prealignment chamber 14, and the reticle 1 is accommodated within protective cover 2. The reticle 1, in the protective cover 2, is unloaded to outside the vacuum atmosphere chamber via the load lock chamber 12.

Through the exposure apparatus relating to the first embodiment, foreign matter may be removed from a protective cover 2, because the cleaning chamber 10 cleans the protective cover 2. Therefore, the protective cover 2 may be maintained in a clean status, and the adherence of foreign matter to the reticle 1 is restricted, so exposure performance increases. In particular, since it is possible to unload the protective cover 2 to outside the vacuum atmosphere chamber in a status in which the reticle 1 is arranged within the clean atmosphere of the interior of the vacuum atmosphere chamber, the reticle 1 does not become contaminated when the protective cover 2 is cleaned.

In addition, the protective cover 2 is merely standing by while the reticle 1 is being used in exposure, so it is possible to use this idle time to clean the protective cover 2, so no adverse effects are exerted on the yield per unit time of the device to be manufactured.

In the first embodiment, the reticle transport part includes a cleaning chamber for cleaning the protective cover, and cleaning of the protective cover is performed in the reticle transport part, but cleaning of the protective cover at other locations may also be performed in the case in which the reticle transport part does not comprise a cleaning chamber.

In addition, in the first embodiment, protective covers are prepared to respectively correspond to the individual reticles, but one protective cover may also be used to perform unloading and loading of a plurality of reticles. Specifically, in the first embodiment, for protecting the reticle 1 unloaded from the exposure part 3, the cleaned protective cover 2 stands by in the prealignment chamber 14. However, a different reticle, loaded into the exposure part 3, may be protected by the cleaned protective cover 2.

In addition, in the first embodiment, exposure is performed as the reticle processing, but it is also possible to apply the present invention to other processing of the reticle.

Figure 8:
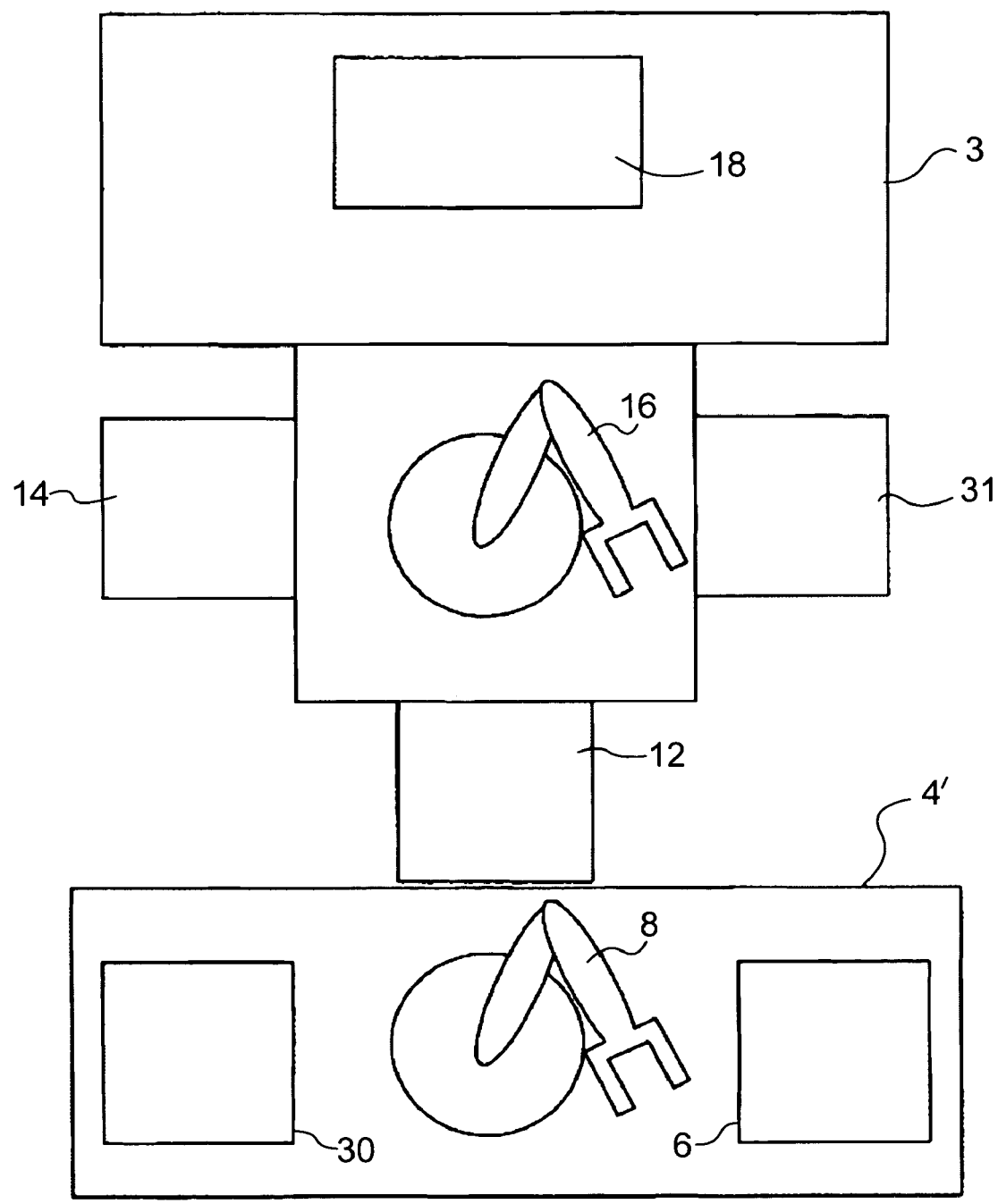
FIG. 8 is a schematic diagram of an exposure apparatus.

Next, the exposure apparatus relating to a second embodiment will be explained. FIG. 8 shows an exposure apparatus according to the second embodiment. As shown in FIG. 8, the exposure apparatus according to the second embodiment includes a protective cover library 30 and a vacuum reticle library 31 in which reticles covered by a protective cover are able to stand by.

While a cleaning chamber 10 was arranged in the reticle transport part 4 of FIG. 1, the protective cover library 30 is arranged in the reticle transport part 4' of FIG. 8. A plurality of cleaned protective covers are arranged in the protective cover library 30. The protective cover 2, transported along with the reticle to a vacuum atmosphere via the load lock chamber 12, is separated from the reticle. After that, only the protective cover 2 is unloaded to the standby side via the load lock chamber 12. Processes up to this point are similar to those of the first embodiment.

In the second embodiment, instead of cleaning the protective cover 2, a different protective cover arranged in the protective cover library 30 is used. Specifically, a separate protective cover arranged in the protective cover library 30 is loaded into the interior of the vacuum atmosphere via the load lock chamber, and the reticle 1 is covered after exposure processing has ended. The reticle 1, covered by the protective cover, may standby in the vacuum reticle library 31, and it may be unloaded to the air side as-is. When this is done, a cleaning chamber 10 need not be arranged beside the exposure apparatus. This reduces the footprint of the exposure apparatus. In addition, since it is possible to use a cleaned protective cover, it is possible to prevent contamination of the reticle.

If ID information related to the reticle, etc. is assigned to the protective cover 2, an ID information rewriter may be included in the protective cover library 30 or at another location. For such rewriting, it is possible to use various well known techniques according to the type of ID information. For example, it is possible to mechanically replace an ID consisting of a barcode or to use software to rewrite ID information. The ID information may be read by an ID reader.

In the first and second embodiments, transport apparatuses 4, 4' are arranged beside the load lock chamber 12. Instead of this, for example, it is possible to transport the reticle using an Automated Guided vehicle with robot, and it is possible to use a configuration in which all or part of the transport apparatus 4, 4' is not arranged beside the exposure apparatus. In this case, it is possible to share the air reticle library 6, the cleaning chamber 10, or the protective cover library 30 among a plurality of exposure apparatuses. When this is done, the footprint of the exposure apparatus in the clean room may be reduced.

In the first and second embodiments, the protective cover is cleaned or replaced each time the reticle and the protective cover separate, but this can be set to any timing. For example, this timing may be decided based on the number of times that the reticle cover is used (it is possible to use the count of the number of times of attachment to the reticle or the number of times, etc. carried in from the air to vacuum as the number of times used) or the usage time, etc.

For example, a user may input the replacement timing directly from a keyboard and store it in a storage part arranged within the control part 26. Replacement or cleaning commands may be output from the control part 26 based on this stored data. The storage part may be arranged separately from the control part 26. In addition, a user may send data via a network to the storage part. In addition, data may be recorded in advance to a variety of recording media such as optical disks, magnetic disks, USB memories, etc. The recording media may be connected to the exposure apparatus to transfer replacement or cleaning timing to the storage part 26. Data such as the number of times, the time, etc. may be directly taken in as timing data, but it is also possible to input other parameters for computing these data to obtain and use the number of times or the time by means of calculations by the control part 26.

A debris detection apparatus may detect the presence or absence of debris at the reticle holding protrusions 2h that connect with the reticle, the positioning pins 2g, or the periphery thereof. Replacement or cleaning may be performed based on the debris detection results. For example, the replacement or cleaning timing may be upon cases where foreign matter is present or upon cases where the amount of foreign matter has exceeded a threshold value.

As shown in FIG. 5, an optical system debris detection apparatus 50 has a light source 51 and a detector 52. The detector 52 detects light that has emerged from the light source 51 and has been reflected by the reticle cover. When foreign matter is present, the foreign matter scatters light and the intensity of the light detected by the detector 52 changes. It is possible to detect the presence or absence of foreign matter from these changes. Any type of apparatus may be used as the foreign matter detection apparatus, as long as it is able to detect the desired foreign matter. A commercially available particle counter may be used. In the example shown in FIG. 5, foreign matter is detected in the prealignment chamber 14, but it may be detected at other locations. For example, such a foreign matter detection mechanism may be arranged in the vacuum reticle library 31 to perform foreign matter detection as in the application example shown in FIG. 8.

An ID mark that indicates distinguishing characteristics related to the reticle cover (the mark may be secured to the cover or removably arranged, and the mark may be a rewritable mark) may be associated with the ID of the reticle and controlled. The reticle cover is stored outside the exposure apparatus, while the reticle is in the exposure apparatus. The ID of the reticle cover, however, identifies the type of reticle. The ID may be read by machine, or it may be directly read by an operator. Of course, in the case where it is possible to directly confirm the type of reticle by means of the reticle cover itself being transparent or a window being provided in the reticle cover, such association need not be performed. In addition, it is also possible to accommodate the reticle cover inside a reticle SMIF pod (RSP) and control the reticle based on an ID mark assigned to the RSP.

Where the ID of the reticle and the ID of the reticle cover are associated to perform control, when replacement of the reticle cover is performed while in progress as discussed above, it is preferable that the ID of the new reticle cover and the ID of the reticle accommodated therein be associated again or that the ID of the new reticle cover be rewritten or replaced.

It is preferable that the reticle covers be controlled so that ID of the reticle cover is stored and a determination is made as to which reticle cover from among the plurality of reticle covers that are present is to be replaced or cleaned. When this is done, it is possible to independently determine the replacement or cleaning times of the respective reticle covers even if a plurality of reticle covers are present.

In the embodiments discussed above, the explanations used exposure processing as an example of reticle processing, but, for example, the present invention may be applied to other processing performed on the reticle, such as the case in which the reticle is cleaned.

As has been explained, the embodiments use a reticle in a clean status in which foreign matter is not adhering. In the exposure process, for example, it is possible to perform the desired transfer, so it is possible to reduce the defect rate of the devices to be manufactured.

Figure 9:
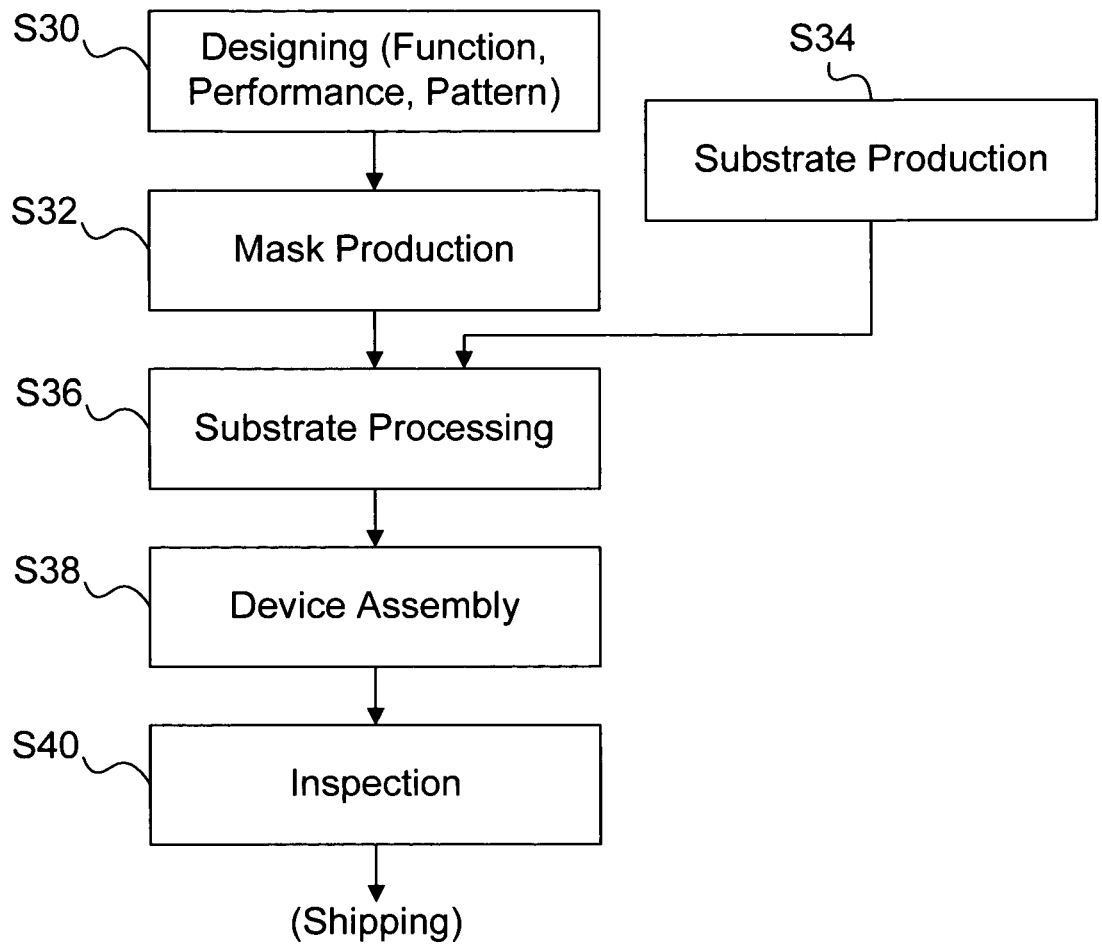
FIG. 9 is a flow chart a microdevice manufacturing process.

As shown in FIG. 9, a microdevice, such as a semiconductor device, is produced by performing, for example, a step S30 of designing the function and the performance of the microdevice, a step S32 of producing a mask (reticle) based on the designing step, a step S34 of producing a substrate as a base material for the device, an exposure process step S36 of exposing the substrate with a pattern of the reticle by using the exposure apparatus, a step S38 of assembling the device (including processing steps such as a dicing step, a bonding step, and a packaging step), and an inspection step S40. The exposure process step includes processes of cleaning or replacing the reticle cover during the wafer exposure process.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A reticle transport apparatus that transports a reticle to and from a processing atmosphere, the reticle transport apparatus comprising:
   a reticle loader for loading the reticle into the processing atmosphere, at least a portion of the reticle being covered by a cover;
   a cover manipulator, in the processing atmosphere, for removing the reticle from the cover and for transferring the cover without the removed reticle to the reticle loader for unloading the cover from the processing atmosphere; and
   a cover cleaner, outside of the processing atmosphere, for cleaning the cover when the reticle is removed.

2. A reticle transport apparatus according to claim 1, wherein the cover manipulator inserts the reticle into a second cover different from the cover.

3. A reticle transport apparatus according to claim 1, wherein the cover manipulator inserts the reticle into the cover after cleaning.

4. A reticle transport apparatus according to claim 1, wherein the processing atmosphere is a vacuum atmosphere.

5. A reticle transport apparatus described in claim 1, further comprising a load lock chamber having an inner atmosphere, the inner atmosphere changing between the processing atmosphere and an ambient atmosphere, wherein the reticle loader loads the reticle into the processing atmosphere via the load lock chamber.

6. A reticle transport apparatus according to claim 1, wherein the processing atmosphere is an exposure atmosphere.

7. A reticle transport apparatus according to claim 1, wherein the cover covers at least the region where the pattern of the reticle is formed.

8. A reticle transport apparatus according to claim 1, wherein the cover protects the reticle.

9. An exposure apparatus that transfers a pattern formed on a reticle to a photosensitive substrate; the exposure apparatus comprising the reticle transport apparatus according to claim 1.

10. An exposure apparatus that transfers a pattern formed on a reticle arranged within a processing atmosphere to a photosensitive substrate, the exposure apparatus comprising:
    a reticle loader for loading the reticle into the processing atmosphere, at least a portion of the reticle being covered by a cover;
    a cover detacher in the processing atmosphere for detaching the cover from the reticle; and
    a cover unloader for unloading the detached cover from the processing atmosphere, wherein after cleaning, the reticle loader loads the cover, without the reticle, into the processing atmosphere.

11. An exposure apparatus according to claim 10, wherein the exposure atmosphere is a vacuum atmosphere.

12. An exposure apparatus according to claim 10, wherein the cover covers at least the region where the pattern of the reticle is formed.

13. A reticle transport method for transporting a reticle to and from a processing atmosphere, the method comprising:
- loading the reticle into the processing atmosphere, at least a portion of the reticle being covered by a cover;
- detaching the cover from the reticle in the processing atmosphere;
- unloading the detached cover from the processing atmosphere; and
- cleaning the cover when the reticle is removed.

14. A reticle transport method for transporting a reticle to and from a processing atmosphere, the method comprising:
- loading the reticle into the processing atmosphere at least a portion of the reticle being covered by a cover;
- detaching the cover from the reticle in the processing atmosphere;
- unloading the detached cover from the processing atmosphere; and
- loading the cover, without the reticle, into the processing atmosphere after cleaning.

15. An exposure method according to claim 14, wherein the cover covers at least the region where the pattern of the reticle is formed.

16. A reticle processing method, comprising:
- transporting the reticle to a desired position, at least a portion of the reticle being covered with a first cover;
- detaching the first cover from the reticle;
- performing a desired processing on the reticle;
- covering the reticle with a second cover different from the first cover; and
- cleaning one of the first and second covers when the reticle is removed.

17. A reticle processing method according to claim 16, wherein the desired processing includes exposure processing that irradiates illumination light to the reticle and exposes and transfers a pattern formed on the reticle onto a photosensitive substrate.

18. A method of manufacturing a device according to claim 17, comprising:
- preparing a sensitive substrate as a base material for the device exposing the sensitive substrate via the exposure processing.

19. A reticle processing method according to claim 16, wherein detaching the first cover occurs within a clean atmosphere.

20. A reticle processing method according to claim 16, wherein detaching the first cover occurs within a vacuum atmosphere.

21. An exposure apparatus according to claim 16, wherein the first cover covers at least the region on which the pattern of the reticle is formed.

* * * * *